United States Patent [19]

Dietrich

[11] Patent Number: 4,942,291

[45] Date of Patent: Jul. 17, 1990

[54] POSITION-RESOLVING SENSOR FOR DETECTING INDIVIDUAL LIGHT FLASHES

[75] Inventor: Klaus Dietrich, Gochsheim, Fed. Rep. of Germany

[73] Assignee: Messerschmitt-Bölkow-Blohm GmbH, Munich, Fed. Rep. of Germany

[21] Appl. No.: 331,092

[22] Filed: Mar. 27, 1989

Related U.S. Application Data

[63] Continuation of Ser. No. 72,021, Jul. 10, 1987, abandoned.

[30] Foreign Application Priority Data

Jul. 29, 1986 [DE] Fed. Rep. of Germany ....... 3625643

[51] Int. Cl.$^5$ .......................... G01J 1/20; G01B 11/26
[52] U.S. Cl. ................................. 250/203.3; 356/152
[58] Field of Search ............ 250/203 R, 227, 578, 550, 250/368, 369; 356/141, 152

[56] References Cited

U.S. PATENT DOCUMENTS

| | | | |
|---|---|---|---|
| 3,704,070 | 11/1972 | Johnson et al. | 356/152 |
| 3,961,191 | 6/1976 | Stoner et al. | 250/368 |
| 4,330,705 | 5/1982 | Kollodge | 250/203 R |
| 4,379,967 | 4/1983 | McIntyre | 250/227 |
| 4,445,030 | 4/1984 | Carlton | 250/203 R |
| 4,491,727 | 1/1985 | Appelbaum et al. | 250/203 R |
| 4,554,459 | 11/1985 | Tsutsumi et al. | 250/550 |
| 4,580,055 | 4/1986 | Barford | 250/369 |
| 4,672,208 | 6/1987 | Moore | 250/368 |

Primary Examiner—David C. Nelms
Assistant Examiner—Michael Messinger
Attorney, Agent, or Firm—Kenyon & Kenyon

[57] ABSTRACT

A position-resolving sensor for detecting individual light flashes with a multiplicity of adjacent light-receiving elements and an evaluating circuit which determines the light-receiving element which is struck by a light flash. The sensor comprises light-receiving elements subdivided into a plurality of groups such that each light-receiving element is exclusively adjacent to light-receiving elements belonging to other groups. Each group of light-receiving elements is associated with a row of light detectors and at least one optical connecting element establishes a light-conducting connection between each individual light-receiving element and light detectors which are selected in accordance with a given code from the assigned row of light detectors. A high solid-angle resolution can be achieved with few light detectors. In addition, that order number of the light-receiving element is read out which has registered the light flash, directly in a digital code.

12 Claims, 2 Drawing Sheets

POSITION-RESOLVING SENSOR FOR DETECTING INDIVIDUAL LIGHT FLASHES

This application is a continuation of application Ser. No. 072,021, filed July 10, 1987, now abandoned.

BACKGROUND OF THE INVENTION

The present invention relates to a position-resolving sensor for detecting individual light flashes.

Such sensors are used as laser warning sensors with a high angular resolution.

In known laser warning sensors with high angular resolution, the solid angle to be monitored is subdivided into a multiplicity of individual solid angle segments and is observed by a laser warning sensor with a "facet structure". To determine the solid angle from which a laser beam emanates, a separate radiation detector is either assigned to each solid angle segment or the radiation incident on the individual facets is fed to a single detector, for instance, by means of glass fibers which have different lengths for each facet. The first solution has the disadvantage of high costs particularly for high angular resolution, in which many detectors are required. For the second solution, a high-resolution time measuring device is required; in addition, a signal must be made available obtained from the entire observed solid angle. Thus, this solution has the disadvantage that a large amount of technical means is required.

SUMMARY OF THE INVENTION

It is an object of the present invention to provide a position-resolving sensor which can be used, for instance, as a laser warning sensor and which permits high angular resolution with a small amount of apparatus and therefore, low costs.

The above and other objects of the present invention are achieved by a position-resolving sensor for detecting individual light flashes having a multiplicity of adjacent light-receiving elements and an evaluating circuit which determines the light-receiving element upon which a light flash impinges, wherein: the light-receiving elements are subdivided into a plurality of groups such that each light-receiving element borders exclusively on light-receiving elements of one group belonging to other groups, each group of light-receiving elements being associated with a number of light detectors, at least one optical connecting element establishing a light-conducting connection between each individual light-receiving element and light detectors which are selected from the associated row of light detectors in accordance with a defined code.

According to the invention, a position-resolving sensor for picking up individual light flashes is further developed in such a manner that the individual light-receiving elements are subdivided into several groups such that each light-receiving element adjoins exclusively light-receiving elements belonging to other groups. In a manner known per se, each light-receiving element monitors a given solid angle segment which adjoin each other without gap and observe a given solid angle region or the entire solid angle, depending on the problem statement. Each group of light-receiving elements is associated with a row of light detectors which are connected by optical connecting elements in accordance with a definite code to the corresponding light-receiving elements.

The number of light detectors assigned to a group of light-receiving elements is determined by the number of light-receiving elements in this group as well as the desired code. If the order number of the light-receiving element which has registered a light flash was issued, for instance, in binary code, only ten detectors per group are required for, for instance, 1024 light-receiving elements per group, the output signal of which indicates as a ten-bit word the order number of the illuminating light-receiving element. According to the state of the art, where one light detector is assigned to each light-receiving element, 1024 detectors and corresponding subsequent evaluating circuits would be required, on the other hand.

Nevertheless, it is assured by the subdivision of the light-receiving elements into several groups in accordance with the invention that the code by which the order number of the illuminated light-receiving elements is issued is not falsified by the possibility that the light flash strikes simultaneously two light-receiving elements, since light-receiving elements belonging to different groups always adjoin each other, a light flash striking simultaneously two light receiving elements generates output signals in light detectors belonging to different groups where, however, the pertinent order number is issued in the desired code in each group. For instance, the position-resolving sensor can comprise an event selector which is constructed with electronic means known per se and determines the solid angle of the light flash if adjacent light-receiving elements are illuminated simultaneously which belong to different groups.

Depending on the application, the light-receiving elements can be arranged in a row or as an array. In an arrangement in the form of a row, at least two groups are required and in an arrangement in the form of an array, three groups are necessary so that it is assured that no light-receiving elements belonging to the same groups are adjacent to each other.

The optical connecting element which establishes, according to the desired code, a light-conducting connection between each individual light-receiving element and the associated light detectors, can be designed in any desired manner, for instance, it may contain bundles of light-conducting fibers.

According to one embodiment of the invention, the optical connecting element has a microprism plate which contains a location-dependent prism pattern which subdivides the light striking each light-receiving element into as many individual beams as is required according to the selected code for representing the order number of this light-receiving element and puts the individual beams to the corresponding light detectors.

In a further embodiment, light-conducting elements are provided.

In a further embodiment, a further simplification of the design is provided. If, for instance, a microprism plate is used, it is possible to blacken the microprism elements which direct light to detectors which always deliver the signal "null" when the order number is displayed, so that no light can strike these detectors when a light flash occurs.

A further embodiment is described which permits realizing directional selectivity in a simple manner. The direction-selective element or the facet eye consists of light-impermeable material in which a passage canal is provided for each light-receiving element, the position and direction of which permits only the incidence of light from the solid angle segment in question.

BRIEF DESCRIPTION OF THE DRAWINGS

The invention will be explained in greater detail in the following detailed description with reference to the drawings in which.

DETAILED DESCRIPTION

Figure 1:
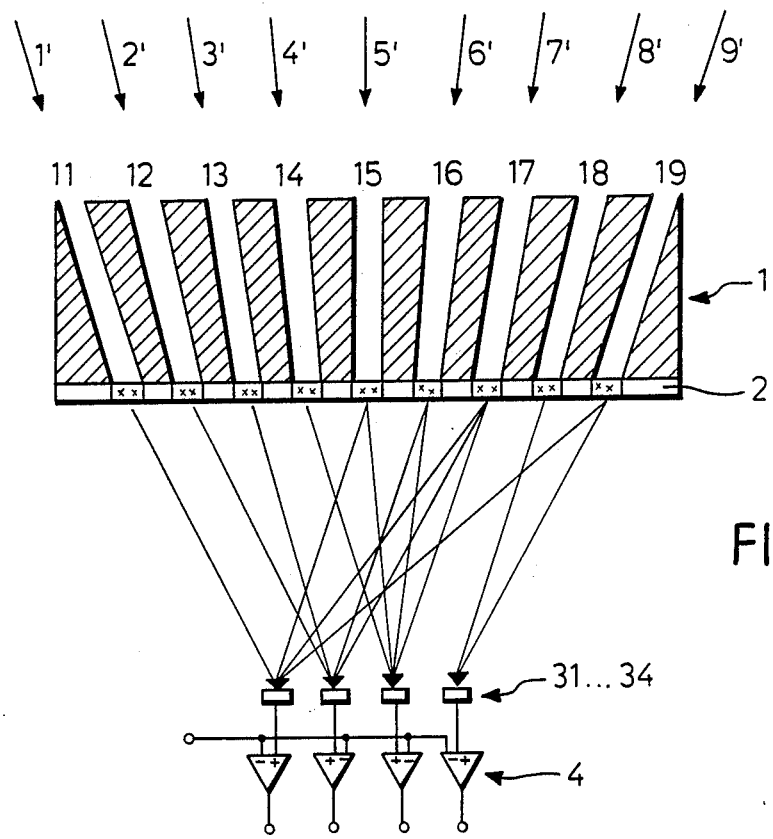
FIG. 1 shows schematically a sensor according to the invention in a cross section.

FIG. 1 shows schematically a position-resolving sensor according to the invention in a cross section. For simplifying the presentation, only light-receiving elements belonging to one group are shown. The sensor has a direction-selective element 1 which contains a number of light passage canals 11 to 19. The inclination of the light passage canals 11 ... 19 is chosen such that only light beams 1' ... 9' coming from a given solid angle segment can pass through. At the end of the light passage canals 11 ... 19 on the light exit side of the light passage canals 11 ... 19, a microprism plate 2 is arranged which has a position-dependent prism pattern and directs the light to detectors 31 ... 34. The position-dependent prism pattern is designed so that the light which passes through a given light passage canal is fed only to those detectors which must receive a signal for coding the solid angle segment.

The detectors 31 ... 34 are coupled to an evaluation circuit 4 which is shown only schematically in FIG. 1 and which outputs the order number of the light-receiving element which has been struck by a light flash in coded form, for instance, in binary code. The evaluating circuit can be designed in any desired form so that a description can be dispensed with.

As already explained, FIG. 1 only shows a schematic cross section through a sensor according to the invention in which, for simplifying the presentation, only those light passage canals and detectors are shown which belong to one group.

Figure 2:
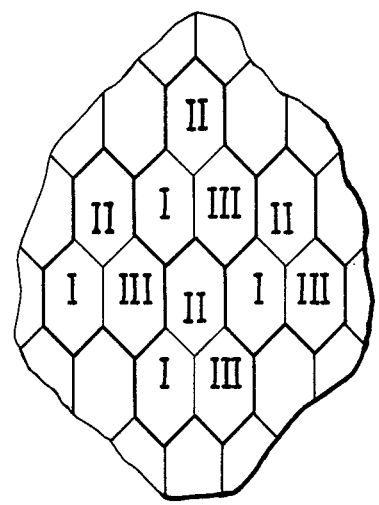
FIG. 2 shows an example of an arrangement of the groups of light-receiving elements.

FIG. 2 shows one possible arrangement of light receiving elements belonging to three groups I ... III. As can be seen from FIG. 2, light-receiving elements belonging exclusively to other groups adjoin a given light-receiving element. It is precluded thereby that a light beam striking the boundary between two light receiving elements leads to falsification of the code.

Figure 3:
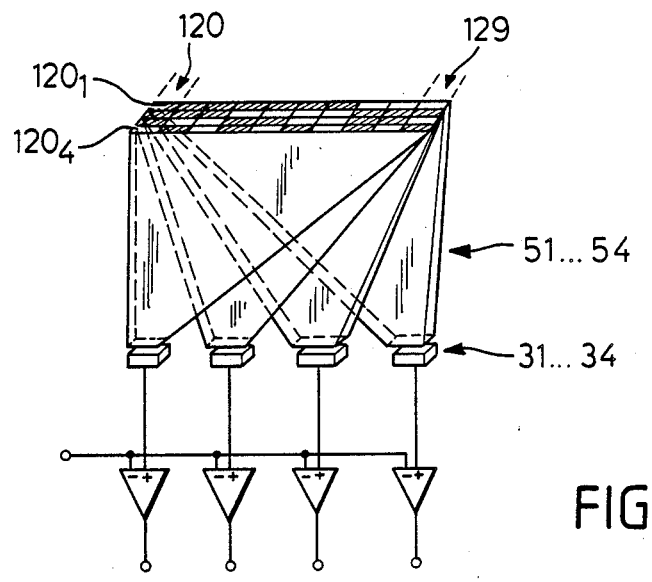
FIG. 3 shows an example of a row-wise arrangement of the light-receiving elements.
Figure 4:
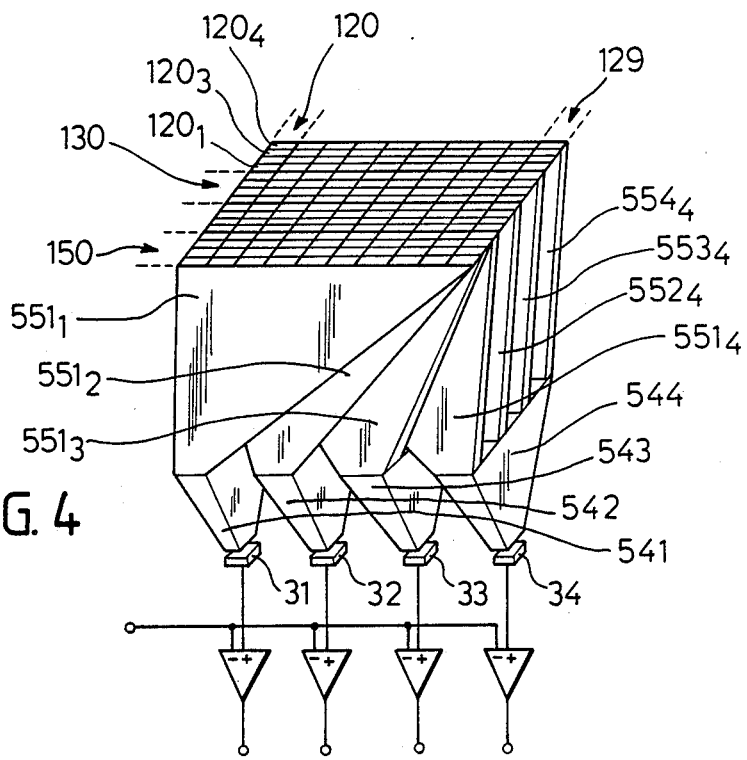
FIG. 4 shows an example of an arrangement of the light-receiving elements in the form of an array.

In FIGS. 3 and 4, further embodiments for the light-conducting connecting elements are given. For reasons of clarity, only the light-receiving elements of one group are shown; in the case of a realization according to the invention in at least two or three groups, the embodiments must be multiplied accordingly.

FIG. 3 shows an example for the arrangement of the light-receiving elements in row form. Ten light receiving elements 120 to 129 are arranged side by side. Each light-receiving element consists of four sub areas $120_1$ ... $120_4$ ... $129_4$. The respective surfaces $X_1$ ... $X_4$ are connected to the detectors 31 ... 34 via light conducting plates 51 ... 54. Depending on the desired code, in this case a binary code, a part of the surfaces is blackened in each light-receiving element in such a manner that the binary-encoded order number 1 ... 10 of the light-receiving element is generated as the output signal of the detectors.

FIG. 4 shows an embodiment in which light-receiving elements 120 ... 129, 130 ... 150 are arranged in the form of an array. Each light-receiving element consists of several surfaces $x_i$ which are connected via light conduction plates $551_1$, $551_2$, ... $551_4$, $552_i$, $553_i$ and $554_i$ ($i = 1 ... 4$) to detectors 31 ... 34. The selection of a definite code, for instance, a binary code, is again accomplished by a blackening of individual subareas $x_i$ of the light-receiving elements. It is pointed out expressly that, for a simplified graphic presentation, only part of the light conductor plates and detectors, respectively, is shown which are required for the binary encoding of the order number of the individual light-receiving elements.

Otherwise, the design and operation of the embodiment shown in FIG. 4 corresponds to the example explained in FIGS. 1 to 3.

The invention has been described above with the aid of an embodiment without limitation of the general idea of the invention to subdivide the light receiving elements into several groups where only light-receiving elements belonging to different groups are adjacent to each other.

It goes without saying that within this general idea of the invention, different modifications are possible:

For instance, the light-receiving elements can be divided into more groups than necessary for fulfilling the condition "no light-receiving element adjoins an element of the same group".

The light-receiving element can, of course, be designed in any desired manner and adapted to the wavelength of the incident radiation.

Also the optical connecting element may be of any design: the uncoded optical connection provided according to the invention can be achieved, for instance, by a suitable selection or combination of light reflection, light refraction, light absorption, light polarization, and/or light scattering.

The use of the position-resolving sensor according to the invention is, of course, not limited to laser-warning sensors. Rather, the sensor according to the invention is suitable for detecting any desired light flashes as long as two light flashes coming from different solid angles do not overlap in time. However, by a suitable subdivision into "macro groups" and additional logic circuits, detection may be possible also in such cases.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A position-resolving sensor for detecting individual light flashes having a multiplicity of adjacent light-receiving elements and an evaluating circuit which determines the light-receiving element upon which a light-flash impinges, wherein the light-receiving elements are subdivided into a plurality of groups such that each group of light-receiving elements borders exclusively on light-receiving elements belonging to other groups, each group of light-receiving elements being associated with a number of light detectors, at least one optical connecting element establishing a light-conducting connection between each individual light-receiving element and the light detectors, said light detectors being selected from the number of light detectors in accordance with a defined code.

2. The sensor recited in claim 1, wherein the light-receiving elements form a row and are subdivided into at least two groups.

3. The sensor recited in claim 1, wherein the light-receiving elements form an array and are subdivided into at least three groups.

4. The sensor recited in claim 1, wherein the optical connecting element comprises a microprism plate.

5. The sensor recited in claim 1, wherein the optical connecting element comprises a multiplicity of light-conducting elements.

6. The sensor recited in claim 4, wherein the light-receiving elements have light-absorbing zones which are distributed in accordance with the selected code.

7. The sensor recited in claim 1, wherein, in determining the direction from which a registered light flashes comes, a direction-selective element or a facet eye is arranged in the direction of the light ahead of the light-receiving element.

8. The sensor recited in claim 7, wherein the direction-selective element comprises a material opaque to light, in which a passage according to the associated solid angle segment is provided for each light-receiving element.

9. The sensor recited in claim 1, wherein the code is a binary code.

10. The sensor recited in claim 1, wherein the code is a Gray code.

11. The sensor recited in claim 1, wherein the evaluating circuit comprises an event selector which determines the solid angle of the light flash if simultaneously adjacent light-receiving elements which belong to different groups are illuminated.

12. The sensor recited in claim 1, wherein said sensor is used as a laser warning sensor.

* * * * *